(12) United States Patent
Kummerl et al.

(10) Patent No.: US 12,364,052 B2
(45) Date of Patent: Jul. 15, 2025

(54) INTEGRATED FILTER OPTICAL PACKAGE

(71) Applicant: TEXAS INSTRUMENTS INCORPORATED, Dallas, TX (US)

(72) Inventors: Steven Alfred Kummerl, Carrollton, TX (US); Simon Joshua Jacobs, Allen, TX (US); James Richard Huckabee, Sherman, TX (US); Jo Bito, Dallas, TX (US); Rongwei Zhang, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 409 days.

(21) Appl. No.: 16/539,442

(22) Filed: Aug. 13, 2019

(65) Prior Publication Data

US 2021/0050459 A1 Feb. 18, 2021

(51) Int. Cl.
*H10F 77/30* (2025.01)
*G02B 5/20* (2006.01)
(Continued)

(52) U.S. Cl.
CPC ............. *H10F 77/30* (2025.01); *G02B 5/208* (2013.01); *H01L 24/32* (2013.01); *H01L 24/48* (2013.01); *H01L 24/73* (2013.01); *H01L 24/83* (2013.01); *H01L 24/85* (2013.01); *H01L 24/92* (2013.01); *H10F 77/50* (2025.01); *H10F 77/60* (2025.01); *H10F 77/93* (2025.01); *H01L 2224/32245* (2013.01); *H01L 2224/48091* (2013.01); *H01L 2224/48106* (2013.01); *H01L 2224/48247* (2013.01); *H01L 2224/73265* (2013.01); *H01L 2224/92247* (2013.01)

(58) Field of Classification Search
CPC ... H01L 31/02002; H01L 24/48; H01L 24/32; H01L 24/83; H01L 24/85; H01L 2224/73265; H01L 2224/92247; H01L 2224/32245; H01L 2224/48247; H01L 2224/04042; H01L 31/0216; H01L 31/0203; H01L 31/02162; H01L 31/02327; G02B 5/226; G02B 5/208; H10F 77/30; H10F 77/50; H10F 77/60; H10F 77/93; H10F 77/331; H10F 77/413
See application file for complete search history.

(56) References Cited

U.S. PATENT DOCUMENTS 5,455,415 A * 10/1995 Yamada ............... B60H 1/0075
250/214.1
6,586,824 B1 * 7/2003 Glenn ................. H01L 23/3128
257/239

(Continued)

*Primary Examiner* — Khaja Ahmad
*Assistant Examiner* — Sun Mi Kim King
(74) *Attorney, Agent, or Firm* — Yudong Kim; Frank D. Cimino

(57) ABSTRACT

An integrated filter optical package including an ambient light sensor that incorporates an infrared (IR) filter in an integrated circuit (IC) stacked-die configuration is provided. The integrated filter optical package incorporates an infrared (IR) coated glass layer to filter out or block IR light while allowing visible (ambient) light to pass through to a light sensitive die having a light sensor. The ambient light sensor detects an amount of visible light that passes through the IR coated glass layer and adjusts a brightness or intensity of a display screen on an electronic device accordingly so that the display screen is readable.

34 Claims, 4 Drawing Sheets

(51) Int. Cl.
*H01L 23/00* (2006.01)
*H10F 77/00* (2025.01)
*H10F 77/50* (2025.01)
*H10F 77/60* (2025.01)

(56) References Cited

U.S. PATENT DOCUMENTS

| | | | |
|---|---|---|---|
| 8,912,635 B2* | 12/2014 | Tan | H01L 21/561 |
| | | | 257/676 |
| 10,043,924 B1* | 8/2018 | Kaufmann | H01L 31/02327 |
| 2004/0188699 A1* | 9/2004 | Kameyama | H01L 24/48 |
| | | | 257/E33.059 |
| 2005/0133878 A1* | 6/2005 | Huang | H01L 31/0203 |
| | | | 257/433 |
| 2011/0089547 A1* | 4/2011 | Holloway | H01L 23/4951 |
| | | | 257/676 |
| 2013/0187260 A1* | 7/2013 | Kelkar | H01L 23/4951 |
| | | | 257/676 |
| 2018/0364095 A1* | 12/2018 | Nagaya | G02B 5/28 |

* cited by examiner

INTEGRATED FILTER OPTICAL PACKAGE

TECHNICAL FIELD

This relates to an integrated filter optical package having an infrared (IR) coated glass layer attached in a stacked die configuration.

BACKGROUND

In an electronic device (e.g., mobile, wearable, tablets, smart thermostats, etc.), an ambient light sensor detects the amount of ambient light and automatically adjusts a brightness or intensity of a display screen of the electronic device based on the brightness or intensity of the ambient light. The ambient light sensor incorporates an infrared (IR) filter to filter out the IR light thus, allowing the visible ambient light to reach an internal light sensor (e.g., die with a light sensor) within the ambient light sensor.

Ambient light sensors include multiple layers of an optical mold compound disposed over a silicon in an integrated circuit (IC). Silicon however, picks up every wavelength of light including IR light. The IR light thus confuses or tricks the sensor that the ambient light is brighter than it really is. Therefore, an IR filter is incorporated into the optical mold compound to filter or block the IR light from reaching the internal light sensor.

SUMMARY

In an example, a light sensor is provided that includes an epoxy molding compound having a mounting surface and a non-mounting surface and electrical terminations disposed around a perimeter of the epoxy molding compound adjacent to the mounting surface. A light sensitive die is embedded in the epoxy molding compound and wire bonds, which are also embedded in the epoxy molding compound, electrically connect the light sensitive die to electrical terminations. An optical film is attached to the light sensitive die and allows visible light to pass through to the light sensitive die. A glass infrared (IR) filter is attached to the optical film and embedded in the epoxy molding compound where the exposed surface of the glass filter is exposed to ambient light.

In another example, an integrated optical filter is provided that includes a package having a mounting surface and a non-mounting surface where the package includes an epoxy molding compound and electrical terminations disposed in a lead frame around a perimeter of the package adjacent to the mounting surface. A light sensitive die is embedded in the epoxy molding compound and wire bonds embedded in the epoxy molding compound electrically connect the light sensitive die to electrical terminations. An optical film is attached to the light sensitive die and allows visible light to pass through to the light sensitive die. A glass filter coated with an infrared filter on an exposed surface and on a non-exposed surface of the glass filter is attached to the optical die attach film and embedded in the epoxy molding compound such that the exposed surface of the glass filter is exposed to ambient light.

In another example, a method of making a light sensor that includes assembling a stacked die configuration that includes attaching a light sensitive die to a die pad and bonding wire bonds from the light sensitive die to electrical terminations arranged in a lead frame. A glass infrared (IR) filter is attached to the light sensitive die via the optical film. A molding compound is molded around the stacked-die configuration to encapsulate the stacked-die configuration leaving an exposed surface of the glass infrared (IR) filter exposed to ambient light and the molding compound is cured.

DETAILED DESCRIPTION

Optical mold compounds mentioned above have several drawbacks. First, the optical mold compound has a high coefficient of thermal expansion (CTE) as compared to the silicon. Thus, as the temperature of the IC changes, the optical mold compound expands/contracts at a much different rate than the $SiO_2$, which in turn can damage the IC and/or snap internal wire bonds. Second, in order to more closely match the CTE between the optical mold compound and the silicon, fillers (e.g., fused silica) are added to the optical mold compound. The fillers however, are not optically clear and thus, attenuate the visible light traveling through the optical mold compound to the internal light sensor, which compromises the performance of the ambient light sensor. Finally, optical mold compounds are more expensive than non-optical mold compounds used in a stacked-die configuration.

Disclosed herein is an integrated filter optical package and more specifically, an ambient light sensor that incorporates an infrared (IR) filter in an integrated circuit (IC) stacked-die configuration (e.g., quad flat no-lead (QFN) package, dual flat no lead (DFN) package, chip-on lead (COL) package, etc.) that utilizes a non-optical mold compound. The ambient light sensor, which can be used in an electronic device (e.g., mobile, wearable, tablets, smart thermostats, etc.), incorporates an IR coated glass layer to filter out or block IR light while allowing visible (ambient) light to pass through to a die having a light sensor. The ambient light sensor detects an amount of visible light that passes through the IR glass filter and adjusts a brightness or intensity of a display screen on the electronic device accordingly so that the display screen is readable. Some attenuation may occur to the visible light as it passes through the IR glass filter, but the attenuation is negligible since the IR glass filter blocks all of the IR light.

Figure 1A:
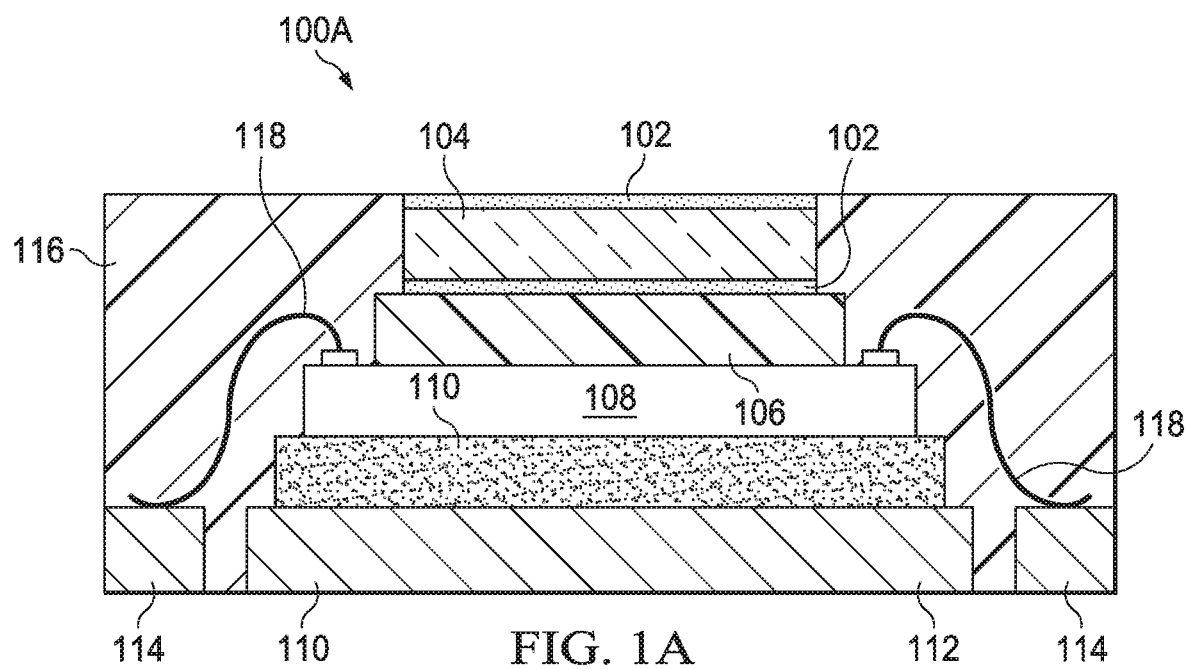
FIGS. 1A and 1B are block diagram representations of example ambient light sensors in a stacked-die configuration.
Figure 1B:
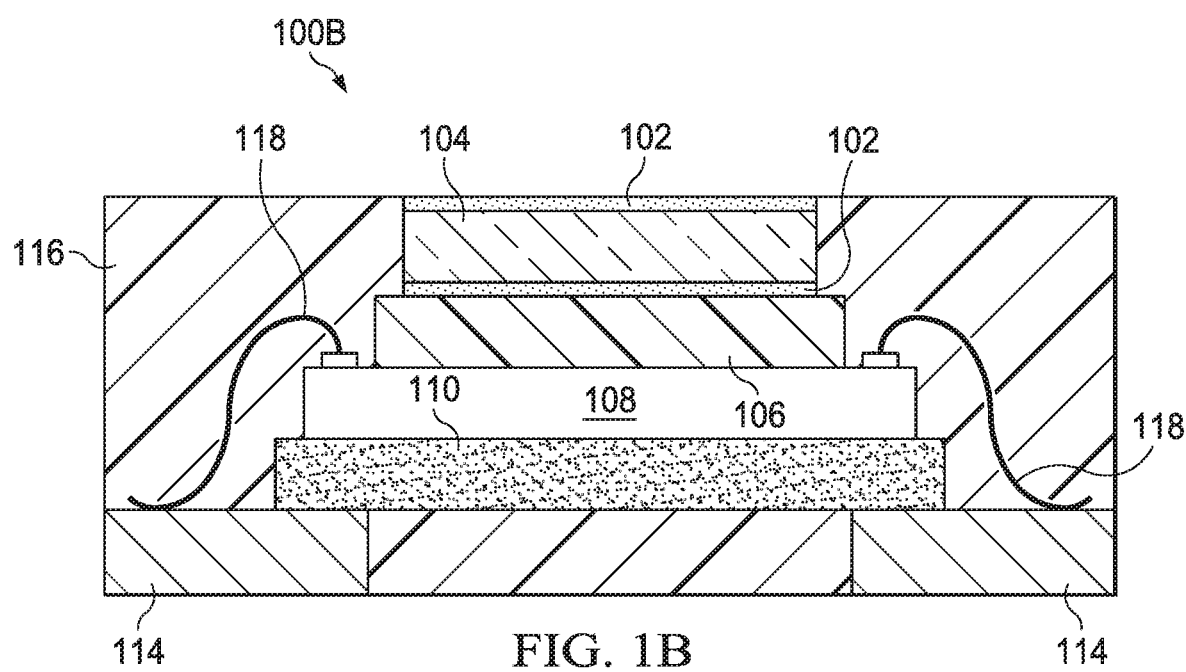

FIGS. 1A and 1B are block diagram representations of example integrated filter optical packages (e.g., ambient light sensor) 100A, 100B in an IC stacked-die configuration that incorporates an IR filter 102 to block out IR light. The IR filter 102 is incorporated with a homogeneous glass layer (e.g., borosilicate glass) 104. More specifically, the IR filter 102 is coated on one or both opposite surfaces of the glass layer 104, as illustrated in FIGS. 1A and 1B. In another example, the IR filter 102 can be comprised of a film having IR properties that is attached to one or both surfaces of the glass layer 104. In the example where the IR filter 102 is applied to both opposite surfaces of the glass layer 104, the IR light is filtered or blocked from passing through the glass layer 104 by either reflecting the IR light and/or absorbing the IR light where it is converted to heat. In another example, the IR filter 102 can be comprised of a material that is embedded into the glass layer 104.

The glass layer 104 is attached, via an optical film (e.g., optical die attach film (ODAF), film over wire material (FOW)) 106, to a light sensitive die (e.g., light sensor) 108 that senses light traveling through the glass layer 104. The optical film 106 is a clear film that allows light to pass through to the light sensitive die 108. In the example in FIG. 1A, the light sensitive die 108 is attached, via a die attach film (DAF) 110, to a die pad (e.g., thermal die pad) 112 in a QFN or DFN type IC package. In the example in FIG. 1B, the light sensitive die 108 is attached, via the die attach film (DAF) 110, to electrical terminations 114 in the COL type package. The stacked-die configuration portion of the light sensor 100A, 100B is packaged (more specifically embedded) in an epoxy non-optical molding compound 116. Wire bonds 118 are provided to electrically connect the light sensitive die 108 to the electrical terminations 114.

Several benefits of the integrated filter optical package include, the epoxy non-optical molding compound employed in the integrated filter optical package can be manufactured such that the CTE can be tuned to closely match the CTE of the other components of the filter, especially the lead frame. The epoxy non-optical molding compound is less expensive than the optical mold compound used in the prior art. Attenuation of the light signal traveling through the filter is mitigated. The glass layer including the IR filter(s) and the optical film can be assembled separately and then attached to the light sensitive die. This leads to broader material selection choices, which leads to better stress performance, better optical performance, increased reliability, and less cost since the size of the IR coated glass layer is no longer tied to the size of the die or wafer. This allows the IR coated glass layer to be mass produced in a single process, which reduces production costs.

Figure 2:
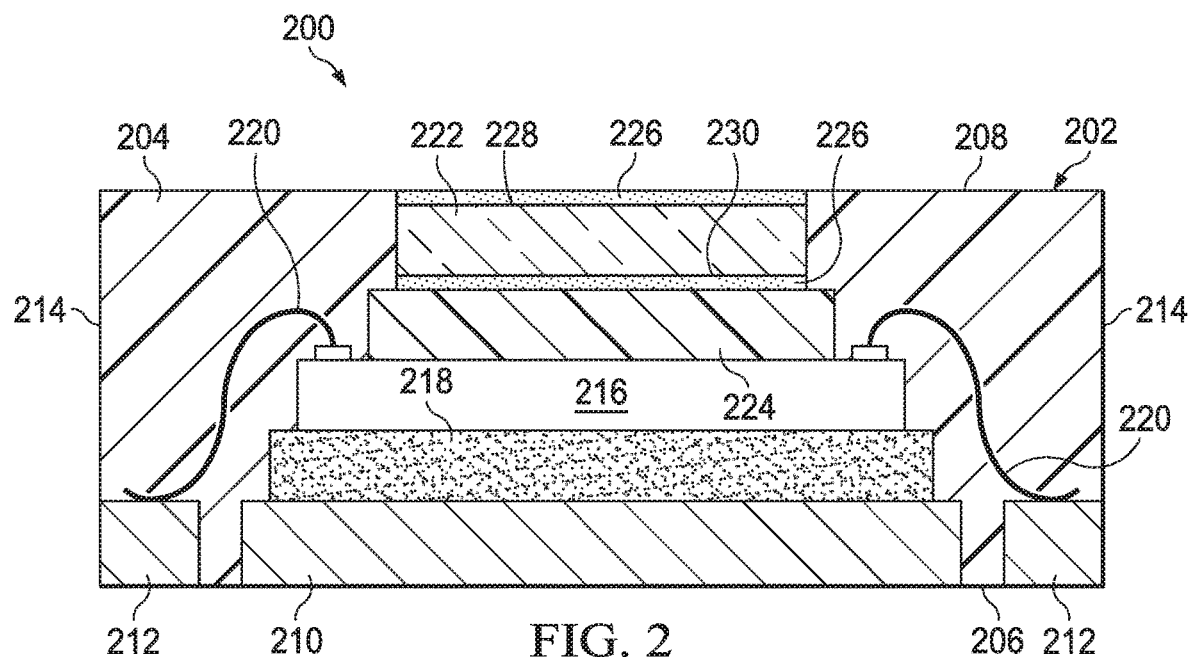
FIG. 2 is an example of an ambient light sensor having a stacked-die configuration.

FIG. 2 is an example of an ambient light sensor 200 packaged in an IC stacked-die configuration (e.g., QFN, DFN, etc.). The sensor 200 includes a package 202 made from a molding compound (e.g., epoxy non-optical molding compound (EMC)) 204. The package 202 includes a mounting (first) surface 206 and a non-mounting (second) surface 208. The mounting surface 206 of the package 202 is the surface of the package 202 that faces a printed circuit board (PCB) when the light sensor 200 is mounted to the PCB. The stacked-die configuration is embedded in the molding compound 204 and includes a die pad (e.g., thermal die pad) 210 adjacent to the mounting surface 206 of the package 202. Electrical terminations 212 are embedded in the molding compound 204 in a lead frame around a perimeter 214 of the package 202 (or alternatively on opposite sides of the perimeter) and adjacent to the mounting surface 206 of the package 202. The stacked-die configuration also includes a light sensitive die (e.g., a die having a light sensor) 216 attached to the die pad 210 via a die attach film (DAF) 218. Wire bonds 220 are attached to the light sensitive die 216 at one end and to the electrical terminations 212 at an opposite end. The wire bonds 220 are attached to the light sensitive die 216 via a bonding process (e.g., ball bonding, wedge bonding, compliant bonding, etc.). The wire bonds 220 form electrical connections between the light sensitive die 216 and the electrical terminations 212.

The stacked-die configuration further includes a homogenous glass layer (e.g., borosilicate glass) 222 attached to the light sensitive die 216 via an optical film (e.g., optical die attach film (ODAF)) 224. In this example, the glass layer 222 has a smaller footprint than the light sensitive die 216. The glass layer 222 is coated (via sputtering) with an infrared (IR) filter 226 on a first (top) surface 228 and/or on a second (bottom) surface 230. The first surface 228 is adjacent to the non-mounting surface 208 of the package 202 and is exposed to ambient light. The second surface 230 is the surface that attaches to the light sensitive die 216 via the optical film 224. The IR filter 226 disposed on the first and/or second surfaces 228, 230 of the glass layer 222 filters or blocks IR light directed at the light sensor 200. In addition, because the glass layer 222 is embedded in the molding compound 204, the molding compound 204 blocks light from entering sides of the glass layer 222 that are normal to the first surface 228 of the glass layer 222.

As mentioned above, the optical film 224 is a clear film that allows light to pass through to the light sensitive die 216. The optical film 224 also mitigates attenuation of the visible light that passes through the filter to the light sensitive die 216 as opposed to a light sensor incorporating the optical mold compound described above. In one example, the optical film 224 can be a film attached to the glass layer 222. In another example, the optical film 224 can be a dispensed material where the glass layer 222 is pressed into the dispensed material and then cured.

Figure 3:
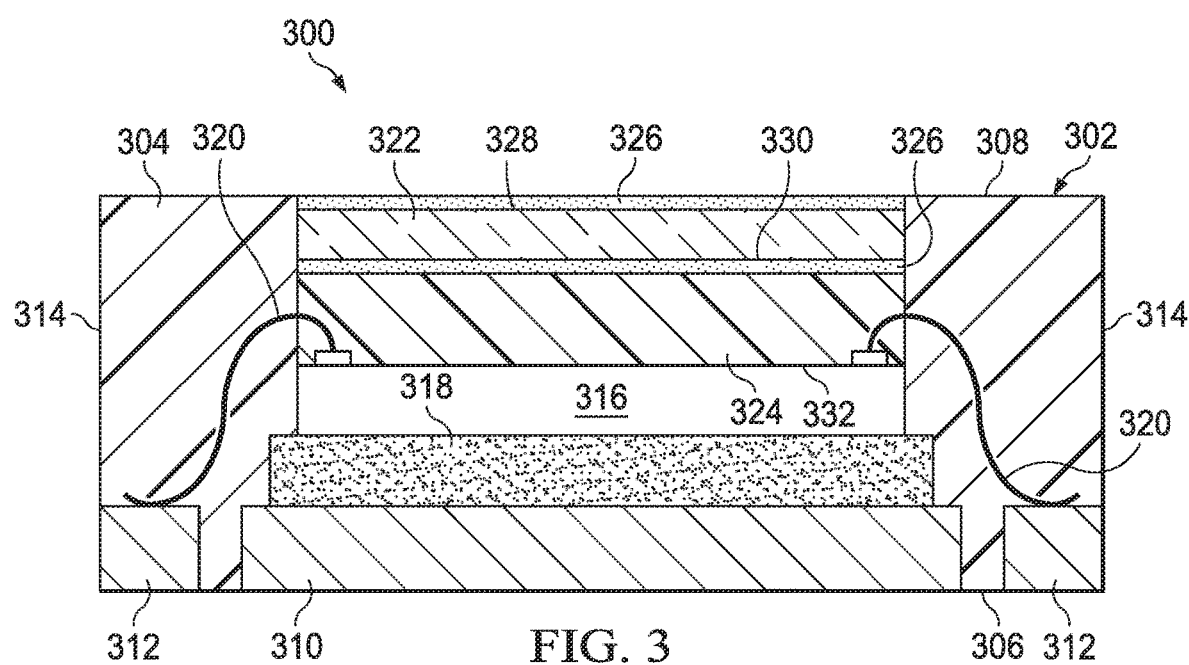
FIG. 3 is another example of an ambient light sensor having a stacked-die configuration.

FIG. 3 is another example of an ambient light sensor 300 packaged in an IC stacked-die configuration (e.g., QFN, DFN, etc.). The sensor 300 includes a package 302 made from a molding compound (e.g., epoxy non-optical molding compound (EMC)) 304. The package 302 includes a mounting (first) surface 306 and a non-mounting (second) surface 308. The mounting surface 306 of the package 302 is the surface of the package 302 that faces the PCB when the light sensor 300 is mounted to the PCB. The stacked-die configuration is embedded in the molding compound 304 and includes a die pad (e.g., thermal die pad) 310 adjacent to the mounting surface 306 of the package 302. Electrical terminations 312 are embedded in the molding compound 304 in a lead frame around a perimeter 314 of the package 302 (or alternatively on opposite sides of the perimeter) and adjacent to the mounting surface 306 of the package 302. The stacked-die configuration also includes a light sensitive die (e.g., a die having a light sensor) 316 attached to the die pad 310 via a die attach film (DAF) 318. Wire bonds 320 are attached to the light sensitive die 316 at one end and to the electrical terminations 312 at an opposite end. The wire bonds 320 are attached to the light sensitive die 316 via a bonding process (e.g., ball bonding, wedge bonding, compliant bonding, etc.). The wire bonds 320 form electrical connections between the light sensitive die 316 and the electrical terminations 312.

The stacked-die configuration further includes a homogenous glass layer (e.g., borosilicate glass) 322 attached to the light sensitive die 316 via an optical film (e.g., a film over wire material) 324 that adheres, via heat, the glass layer 322 to the light sensitive die 316. In this example, the glass layer 322 has a footprint that is equal to or larger than a footprint of the light sensitive die 316. As above, the glass layer 322 is coated (via sputtering) with an infrared (IR) filter 326 on a first surface 328 and/or on a second surface 330. The first surface 328 is adjacent to the non-mounting surface 308 of the package 302 and is exposed to ambient light. The second surface 330 is the surface that attaches to the light sensitive die 316 via the optical film 324. The IR filter 326 disposed on the first and/or second surfaces 328, 330 of the glass layer 322 filters or blocks any IR light directed at the light sensor 300. In addition, because the glass layer 322 is embedded in the molding compound 304, the molding compound 304 blocks all light from entering sides of the glass layer 322 that are normal to the first surface 328 of the glass layer 322.

The optical film 324 is a clear film that allows light to pass through to the light sensitive die 316, but has a thickness larger than the optical film 224 described above and illustrated in FIG. 2. The optical film 324 also mitigates attenuation of the visible light that passes through the filter to the light sensitive die 316 as opposed to a light sensor incorporating the optical mold compound described above. The optical film 324 has liquidous properties and is a B-stage cured material when applied to the glass layer 322. When the glass layer 322 is attached to the light sensitive die 316, the optical film 324 heats up and spreads over a surface 332 of the light sensitive die 316 filling in spaces/voids in the surface 332 while contemporaneously encapsulating the end of the wire bonds 320 that are bonded to the surface 332 of the light sensitive die 316.

Figure 4:
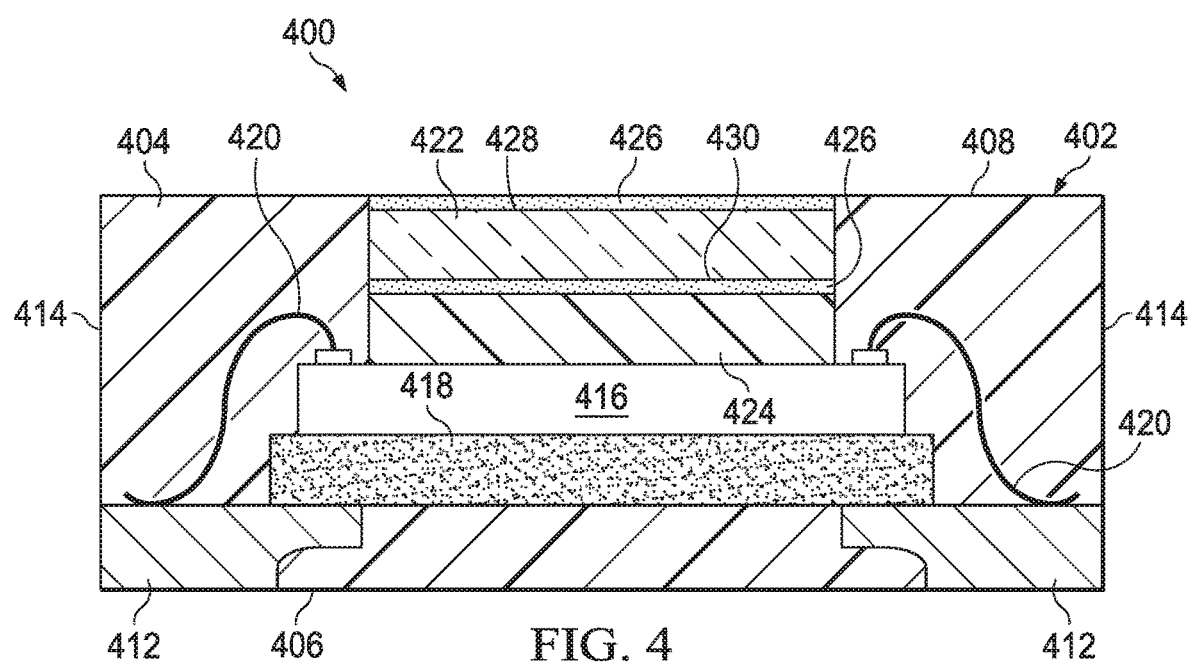
FIG. 4 is another example of an ambient light sensor having a stacked-die configuration.

FIG. 4 is yet another example of an ambient light sensor 400 packaged in an IC stacked-die configuration (e.g., COL). The sensor 400 includes of a package 402 made from a molding compound (e.g., epoxy non-optical molding compound (EMC)) 404. The package 402 includes a mounting (first) surface 406 and a non-mounting (second) surface 408. The mounting surface 406 of the package 402 is the surface of the package 402 that faces the PCB when the light sensor 400 is mounted to the PCB. Electrical terminations 412 are embedded in the molding compound in a lead frame around a perimeter 414 of the package 402 (or alternatively on opposite sides of the perimeter) and adjacent to the mounting surface 406 of the package 402. The stacked-die configuration is embedded in the molding compound 404 and includes a light sensitive die (e.g., a die having a light sensor) 416 attached at opposite ends to the electrical terminations 412 via a die attach film (DAF) 418. Wire bonds 420 are attached to the light sensitive die 416 at one end and to the electrical terminations 412 at an opposite end. The wire bonds 420 are attached to the light sensitive die 416 via a bonding process (e.g., ball bonding, wedge bonding, compliant bonding, etc.). The wire bonds 420 form electrical connections between the light sensitive die 416 and the electrical terminations 412.

The stacked-die configuration further includes a homogenous glass layer (e.g., borosilicate glass) 422 attached to the light sensitive die 416 via an optical film (e.g., optical die attach film (ODAF)) 424. In this example, the glass layer 422 has a smaller footprint than the light sensitive die 416. The glass layer 422 is coated (via sputtering) with an infrared (IR) filter 426 on a first surface 428 and/or on a second surface 430. The first surface 428 is adjacent to the non-mounting surface 408 of the package 402 and is exposed to ambient light. The second surface 430 is the surface that attaches to the light sensitive die 416 via the optical film 424. The IR filter 426 disposed on the first and/or second surfaces 428, 430 of the glass layer 422 filters or blocks any IR light directed at the light sensor 400. In addition, because the glass layer 422 is embedded in the molding compound 404, the molding compound 404 blocks light from entering sides of the glass layer 422 that are normal to the first surface 428 of the glass layer 422. In this example, the glass layer 422 has a smaller footprint than the light sensitive die 416. Thus, the wire bonds 420 are attached to the light sensitive die 416 via a bonding process (e.g., ball bonding, wedge bonding, compliant bonding, etc.).

As mentioned above, the optical film 424 is a clear film that allows light to pass through to the light sensitive die 416. The optical film 424 also mitigates attenuation of the visible light that passes through the filter to the light sensitive die 416 as opposed to a light sensor incorporating the optical mold compound described above attenuating the transmitted light signal in the range of 40%~60% based on filler loading. In one example, the optical film 424 can be a film attached to the glass layer 422. In another example, the optical film 424 can be a dispensed material where the glass layer 422 is pressed into the dispensed material and then cured.

In the above examples, the epoxy non-optical molding compound can be made from fillers and other materials so that the CTE of the epoxy non-optical molding compound can be tuned to closely match the CTE of the other components (e.g., the glass layer, the light sensitive die, the die pad, lead frame). Thus, any expansion/contraction differences between epoxy non-optical molding compound and both the glass layer and the light sensitive die is minimized. CTE values for an unfilled optical mold compound can be in the range of 70 ppm while the typical silica filled mold compounds can be in the range of 10 ppm below glass transition temperature. Since silicon and the copper lead frame is in the range of 3 ppm and 17 ppm respectively, the disparity in CTE value of the optical mold compound will cause much higher stress concentrations across the various structures within the package vs. typical silica filled mold compounds. As a result, it is less likely to snap the wire bonds between the light sensitive die and the electrical terminations in the lead frame. In addition, as mentioned above, the epoxy non-optical molding compound is less expensive than the optical mold compounds used in the prior art.

Figure 5:
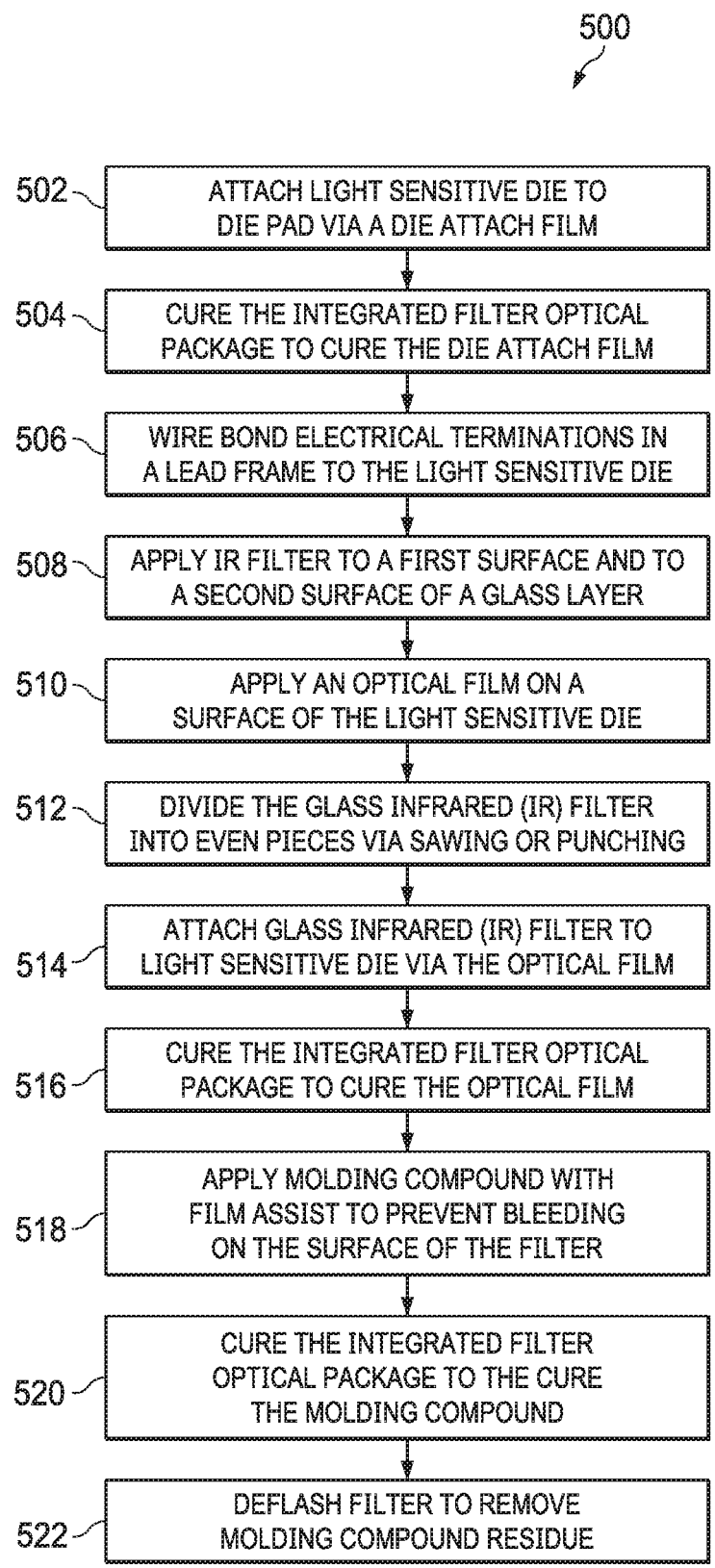
FIG. 5 is a block diagram illustration describing a process of manufacturing an ambient light sensor having a stacked-die configuration.

Referring to FIGS. 2 and 5, a method 500 of manufacturing an integrated filter optical package will now be described. A stacked-die configuration is assembled at 502, by attaching a light sensitive die (e.g., die with a light sensor 216 of FIG. 2) to a die pad (e.g., thermal die pad 210 of FIG. 2) with a die attach film (e.g., die attach film 218 of FIG. 2). At 504, a curing process is performed to cure the die attach film. At 506, electrical terminations (e.g., electrical terminations 212 of FIG. 2), which are arranged in a lead frame, are bonded via wire bonds (e.g., wire bonds 220 of FIG. 2) to the light sensitive die via a bonding process (e.g., ball bonding, wedge bonding, compliant bonding, etc.). At 508, an IR filter (e.g., IR filter 226 of FIG. 2) is applied to a first surface and/or a second surface of a glass layer (e.g., glass layer 222 of FIG. 2) to form an infrared (IR) glass filter. At 510, an optical film (e.g., die attach film 224 of FIG. 2, film over wire 324 of FIG. 3) is applied to a surface of the light sensitive die. At this stage of the method 500 the optical film is a B-stage cured material, which is a partially cured material. The optical film is fully cured during a final curing process further below. At 512, the glass infrared (IR) filter is divided (e.g., sawed, punched) into pieces, each of which have a same size. At 514, the glass infrared (IR) filter is attached to the light sensitive die via the optical film. At 516, the integrated filter optical package undergoes another curing process to cure the optical film. At 518, a molding compound (e.g., epoxy non-optical molding compound (EMC) 204) is applied to encapsulate the filter components. The molding compound includes a film assist to assist in the prevention of the molding compound from bleeding over into the glass layer. At 520, the integrated filter optical package undergoes a final curing process, at which time the epoxy molding compound undergoes a final cure. At 522, the filter is deflashed to remove any molding residue from the molding compound. In some examples, one or more layers of a red, green, blue, white (RGBW) strip can be applied to increase the performance.

Described above are examples of the subject disclosure. It is, of course, not possible to describe every conceivable combination of components or methodologies for purposes of describing the subject disclosure, but one of ordinary skill in the art may recognize that many further combinations and permutations of the subject disclosure are possible. Accordingly, the subject disclosure is intended to embrace all such alterations, modifications and variations that fall within the spirit and scope of the appended claims. In addition, where the disclosure or claims recite "a," "an," "a first," or "another" element, or the equivalent thereof, it should be interpreted to include one or more than one such element, neither requiring nor excluding two or more such elements. Furthermore, to the extent that the term "includes" is used in either the detailed description or the claims, such term is intended to be inclusive in a manner similar to the term "comprising" as "comprising" is interpreted when employed as a transitional word in a claim. Finally, the term "based on" is interpreted to mean based at least in part on.

What is claimed is:

1. A light sensor comprising:
an epoxy non-optical molding compound having a mounting surface and a non-mounting surface;
electrical terminations disposed in a lead frame around a perimeter of the epoxy non-optical molding compound adjacent to the mounting surface, the electrical terminations being part of the lead frame, wherein each of the electrical terminations of the lead frame includes a first portion having a first thickness and a second portion having a second thickness less than the first thickness;
a light sensitive die embedded in the epoxy non-optical molding compound, wherein a footprint of the light sensitive die overlaps a part of the second portion of at least one electrical termination;
wire bonds embedded in the epoxy non-optical molding compound to electrically connect the light sensitive die to the first portions of the electrical terminations, wherein first ends of respective ones of the wire bonds are attached to the light sensitive die and second ends of the respective ones of the wire bonds are bonded to respective ones of the first portions of the electrical terminations;
an optical film attached to the light sensitive die, the optical film allowing visible light to pass through to the light sensitive die; and
a glass layer coated with an infrared (IR) filter on an exposed surface and on a non-exposed surface of respective opposing sides of the glass layer, the glass layer and the IR filter together forming an IR glass filter that comprises a first coating on the exposed surface of the glass layer and a second coating, separate from the first coating, on the non-exposed surface of the glass layer, the IR glass filter being attached to the optical film and embedded in the epoxy non-optical molding compound where the exposed surface of the IR glass filter is exposed to ambient light and where the IR glass filter is disposed in a non-overlapping arrangement with respect to the second portion of a first one of the electrical terminations on one side of the lead frame and the second portion of a second one of the electrical terminations on an opposing side of the lead frame.

2. The light sensor of claim 1 further comprising a thermal die pad embedded in the epoxy non-optical molding compound adjacent to the mounting surface of the epoxy non-optical molding compound and a die attach film attached to the thermal die pad, wherein the light sensitive die is attached to the thermal die pad via the die attach film.

3. The light sensor of claim 2, wherein the glass layer is comprised of a homogenous material.

4. The light sensor of claim 3, wherein the IR glass filter has a footprint smaller than a footprint of the light sensitive die, and wherein the optical film is a die attach film.

5. The light sensor of claim 3, wherein the optical film is a film over wire material that encapsulates an end of the wire bonds attached to the light sensitive die.

6. The light sensor of claim 1 further comprising a die attach film, wherein the light sensitive die is attached to the second portions of the electrical terminations at each end of the light sensitive die via the die attach film.

7. The light sensor of claim 6, wherein a coefficient of thermal expansion of the epoxy non-optical molding compound is tuned to closely match a coefficient of thermal expansion of the glass layer and a coefficient of thermal expansion of the lead frame.

8. The light sensor of claim 7, wherein the IR glass filter has a footprint smaller than a footprint of the light sensitive die, and wherein the optical film is a die attach film.

9. The light sensor of claim 1, wherein the IR filter is sputter coated onto the glass layer.

10. The light sensor of claim 1, wherein the epoxy non-optical mold compound includes silica filled mold compounds with coefficient of thermal expansion (CTE) values in a range of 10 ppm below glass transition temperature.

11. The light sensor of claim 1, wherein a sidewall surface of the IR glass filter includes a sawn texture.

12. The light sensor of claim 1, further comprising:
a layer of white strip applied over the IR filter coated on the exposed surface.

13. The light sensor of claim 1, wherein the IR filter comprises a material that is embedded into the glass layer.

14. The light sensor of claim 1, wherein:
the IR glass filter includes a sidewall surface perpendicular to the non-mounting surface, the sidewall surface having a first portion corresponding to the IR filter coated on the exposed surface, a second portion corresponding to the glass layer, and a third portion corresponding to the IR filter coated on the non-exposed surface; and
the epoxy non-optical molding compound is in contact with the first, second, and third portions of the sidewall surface of the IR glass filter.

15. The light sensor of claim 1, further comprising a die attach film layer disposed between the light sensitive die and the lead frame and configured to couple the light sensitive die to at least the second portion of the first one of the electrical terminations on the one side of the lead frame and the second portion of the second one of the electrical terminations on the opposing side of the lead frame.

16. The light sensor of claim 15, wherein the die attach film layer has a footprint which is larger than a footprint of the light sensitive die.

17. An integrated optical filter package comprising:
an epoxy molding compound having a mounting surface and a non-mounting surface;
electrical terminations disposed in a lead frame around a perimeter of the integrated optical filter package adjacent to the mounting surface of the epoxy molding compound, the electrical terminations being part of the lead frame, wherein each of the electrical terminations of the lead frame includes a first portion having a first thickness and a second portion having a second thickness less than the first thickness;

a light sensitive die embedded in the epoxy molding compound, wherein a footprint of the light sensitive die overlaps a part of the second portion of at least one electrical termination;

wire bonds embedded in the epoxy molding compound to electrically connect the light sensitive die to the first portions of the electrical terminations, wherein first ends of respective ones of the wire bonds are attached to the light sensitive die and second ends of the respective ones of the wire bonds are bonded to respective ones of the first portions of the electrical terminations;

an optical film attached to the light sensitive die, the optical film allowing visible light to pass through to the light sensitive die; and a borosilicate glass layer coated with an infrared (IR) filter on an exposed surface and on a non-exposed surface of respective opposing sides of the borosilicate glass layer, the IR filter and the borosilicate glass layer together forming an IR glass filter that comprises a first coating on the exposed surface of the borosilicate glass layer and a second coating, separate from the first coating, on the non-exposed surface of the borosilicate glass layer, the IR glass filter being attached to the optical film and embedded in the epoxy molding compound where the exposed surface of the IR glass filter is exposed to ambient light and where the IR glass filter is disposed in a non-overlapping arrangement with respect to the second portion of a first one of the electrical terminations on one side of the lead frame and the second portion of a second one of the electrical terminations on an opposing side of the lead frame.

18. The integrated optical filter package of claim 17 further comprising a die pad embedded in the epoxy molding compound adjacent to the mounting surface of the epoxy molding compound.

19. The integrated optical filter package of claim 18, wherein the borosilicate glass layer is comprised of a homogenous material.

20. The integrated optical filter package of claim 19, wherein the IR glass filter has a footprint smaller than a footprint of the light sensitive die, and wherein the optical film is a die attach film.

21. The integrated optical filter package of claim 19, wherein the IR glass filter has a footprint equal to or larger than a footprint of the light sensitive die, and wherein the optical film is a flow over wire material that encapsulates an end of the wire bonds attached to the light sensitive die.

22. The integrated optical filter package of claim 17 further comprising a die attach film, wherein the light sensitive die is attached to the second portions of the electrical terminations at each end of the light sensitive die via the die attach film.

23. The integrated optical filter package of claim 22, wherein the borosilicate glass layer is comprised of a homogenous material.

24. The integrated optical filter package of claim 23, wherein the IR glass filter has a footprint smaller than a footprint of the light sensitive die, and wherein the optical film is a die attach film.

25. The integrated optical filter package of claim 17, wherein the IR filter is sputter coated onto the borosilicate glass layer.

26. The integrated optical filter package of claim 17, wherein the epoxy mold compound is an epoxy non-optical mold compound.

27. The integrated optical filter package of claim 17, wherein the epoxy mold compound includes silica filled mold compounds with coefficient of thermal expansion (CTE) values in a range of 10 ppm below glass transition temperature.

28. An integrated optical filter package comprising:
a light sensitive die embedded in an epoxy molding compound;

wire bonds embedded in the epoxy molding compound to electrically connect the light sensitive die to electrical terminations that extend to at least one external surface of the epoxy molding compound, the electrical terminations being part of a lead frame, wherein each of the electrical terminations of the lead frame includes a first portion having a first thickness and a second portion having a second thickness less than the first thickness, and wherein:

the wire bonds are connected to the first portions of the electrical terminations, with first ends of respective ones of the wire bonds being attached to the light sensitive die and second ends of the respective ones of the wire bonds being bonded to respective ones of the first portions of the electrical terminations; and the light sensitive die is attached to the second portions of the electrical terminations at each end of the light sensitive die via a die attach film, wherein a footprint of the light sensitive die overlaps a part of the second portion of at least one electrical termination;

an optical film attached to the light sensitive die, the optical film allowing visible light to pass through to the light sensitive die; and a glass layer with a sputter coated infrared (IR) filter on an exposed surface and on a non-exposed surface of respective opposing sides of the glass layer, a combination of the glass layer and sputter coated IR filters forming a glass IR filter that comprises a first coating on the exposed surface of the glass layer and a second coating, separate from the first coating, on the non-exposed surface of the glass layer, the glass IR filter being attached to the optical film and embedded in the epoxy molding compound where the exposed surface of the IR glass filter is exposed to ambient light and where the IR glass filter is disposed in a non-overlapping arrangement with respect to the second portion of a first one of the electrical terminations on one side of the lead frame and the second portion of a second one of the electrical terminations on an opposing side of the lead frame.

29. The integrated optical filter package of claim 28 further comprising a die pad embedded in the epoxy molding compound.

30. The integrated optical filter package of claim 28, wherein the glass layer is comprised of a homogenous material.

31. The integrated optical filter package of claim 30, wherein the IR glass filter has a footprint smaller than a footprint of the light sensitive die, and wherein the optical film is a die attach film.

32. The integrated optical filter package of claim 28, wherein the glass layer is borosilicate glass.

33. The integrated optical filter package of claim 28, wherein the epoxy molding compound is an epoxy non-optical molding compound.

34. The integrated optical filter package of claim 28, wherein the epoxy molding compound includes silica filled mold compounds with coefficient of thermal expansion (CTE) values in a range of 10 ppm below glass transition temperature.

* * * * *